(12) United States Patent
Chang et al.

(10) Patent No.: US 9,017,478 B2
(45) Date of Patent: Apr. 28, 2015

(54) APPARATUS AND METHOD FOR EXTRACTING A SILICON INGOT MADE BY AN ELECTROMAGNETIC CONTINUOUS CASTING METHOD

(75) Inventors: Ki Hyun Chang, Yongin-si (KR); Dong Hyun Nam, Seoul (KR)

(73) Assignee: KCC Corporation, Seoul (KR)

( * ) Notice: Subject to any disclaimer, the term of this patent is extended or adjusted under 35 U.S.C. 154(b) by 412 days.

(21) Appl. No.: 13/510,895

(22) PCT Filed: Dec. 14, 2010

(86) PCT No.: PCT/KR2010/008917
§ 371 (c)(1),
(2), (4) Date: May 18, 2012

(87) PCT Pub. No.: WO2011/074847
PCT Pub. Date: Jun. 23, 2011

(65) Prior Publication Data
US 2012/0240635 A1  Sep. 27, 2012

(30) Foreign Application Priority Data
Dec. 14, 2009  (KR) .................. 10-2009-0124176

(51) Int. Cl.
C30B 13/32 (2006.01)
C30B 11/00 (2006.01)
C30B 29/06 (2006.01)

(52) U.S. Cl.
CPC ............. C30B 11/001 (2013.01); C30B 11/007 (2013.01); C30B 29/06 (2013.01)

(58) Field of Classification Search
CPC .... C30B 11/00; C30B 11/001; C30B 11/007; C30B 11/04; C30B 13/00; C30B 13/005; C30B 13/08; C30B 13/28; C30B 13/32; C30B 9/00; C30B 9/04

USPC ......... 117/11, 73, 81, 83, 200–202, 206, 223, 117/924, 928, 931–932
See application file for complete search history.

(56) References Cited

U.S. PATENT DOCUMENTS 6,027,563 A * 2/2000 Choudhury et al. ............ 117/18

FOREIGN PATENT DOCUMENTS

EP  0499471  8/1992
JP  63-319287  12/1988
(Continued)

OTHER PUBLICATIONS

International Search Report, dated Aug. 30, 2011, issued in PCT/KR2010/008917.
(Continued)

Primary Examiner — Kenneth A Bratland, Jr.
(74) Attorney, Agent, or Firm — Hammer & Associates, P.C.

(57) ABSTRACT

Provided are an apparatus and method of extracting a silicon ingot. The apparatus for extracting a silicon ingot includes a chamber in which a silicon source material introduced into a cold crucible is melted, a primary extraction apparatus vertically movably installed in the chamber and configured to solidify the molten silicon to extract the silicon ingot, a movable apparatus configured to horizontally move the primary extraction apparatus, and a secondary extraction apparatus vertically movably installed under the chamber and configured to extract the silicon ingot in a state in which the primary extraction apparatus is moved to one side. Therefore, as the height of the extraction apparatus is reduced, manufacturing cost of equipment can be reduced and installation space of the extraction apparatus can also be reduced.

13 Claims, 9 Drawing Sheets

(56) References Cited

FOREIGN PATENT DOCUMENTS

| | | | |
|---|---|---|---|
| JP | 06-209037 | | 7/1994 |
| JP | 07-138012 | * | 5/1995 |
| JP | 09-183685 | | 7/1997 |
| KR | 10-2007-0118945 | | 12/2007 |

OTHER PUBLICATIONS

Office Action issued on Aug. 13, 2013 against the corresponding Japanese Patent Application No. 2012-541961.

* cited by examiner

APPARATUS AND METHOD FOR EXTRACTING A SILICON INGOT MADE BY AN ELECTROMAGNETIC CONTINUOUS CASTING METHOD

CROSS-REFERENCE TO RELATED APPLICATIONS

The present application is a U.S. National Phase patent application under 35 U.S.C. 371 of International Application No. PCT/KR2010/008917, filed Dec. 14, 2010, which claims priority to Korean Patent Application No. 10-2009-0124176, filed Dec. 14, 2009, both of which are expressly incorporated herein by reference in their entireties.

BACKGROUND

1. Field of the Invention

The present invention relates to a silicon ingot for a solar cell, and more particularly, to an apparatus and method of extracting a silicon ingot capable of extracting the silicon ingot through two steps to reduce the height of an apparatus for extracting the silicon ingot.

2. Discussion of Related Art

A silicon wafer, which has been traditionally used as a substrate for a solar cell, is manufactured by thinly cutting a directionally solidified silicon ingot. Here, quality and cost of the silicon wafer are determined by quality and cost of the silicon ingot.

Accordingly, in order to increase the quality of the silicon wafer and reduce the cost thereof, manufacturing cost of a high quality directionally solidified silicon ingot should be reduced. For this, an electromagnetic continuous casting method using a crucible formed of graphite or quartz, which is a casting material for solidifying the ingot, with no casting loss, has begun being used.

A conventional electromagnetic continuous casting method uses a cold crucible for continuous casting, which is manufactured by an induction coil and a conductive material (in general, using oxygen-free copper) disposed inside the induction coil, and a lower portion of which is open. At least a circumferential portion of the cold crucible has a structure divided into a plurality of segments by longitudinal slits, i.e., a water cooling structure through which cooling water passes to solidify a molten metal and protect a cold crucible.

The longitudinal slits allow a magnetic field generated by a radio frequency current flowing through the induction coil to flow into the cold crucible to generate an induction current from a dissolved source material, and thus, Joule's heating effect caused thereby heats and dissolves a continuously supplied charged source material, and generates an electromagnetic force toward the inside of the cold crucible, reducing contact between the dissolved source material and the cold crucible.

In addition, a dissolved silicon solution flows downward along the cold crucible while being solidified, and when a source material is continuously supplied, a directionally solidified ingot can be continuously manufactured.

Since such an electromagnetic continuous casting method reduces contact with the cold crucible, contamination of the source material is suppressed and quality of the ingot is improved, and simultaneously, the casting is not consumed, so that maintenance cost is reduced and productivity is improved.

However, the above-mentioned conventional electromagnetic continuous casting method has the following problems.

First, the conventional electromagnetic continuous casting apparatus should increase yield of each batch to accomplish mass production. However, since continuous casting must be performed in a vertical direction, the size of equipment should be increased exponentially according to an increase in yield. When the size of the equipment is increased as described above, floor height of a building, etc. must be sufficiently secured and thus equipment investment must be increased.

Next, in the conventional art, a sufficient stroke of an extraction apparatus must be secured to stably extract the ingot to a designed length at an appropriate extraction speed and take the extracted ingot out of the apparatus. For example, in order to extract the silicon ingot having a length of 1 m, a stroke of 2 m, which is at least two times of the ingot length, must be secured.

For the purpose of easier description, FIGS. 1 to 3 are operation views showing a process of extracting a silicon ingot using the conventional art.

Referring to FIG. 1, a chamber 1 includes a gas inlet 2 and a gas outlet 3. A silicon source material introduced into a cold crucible is melted in the chamber 1. The molten silicon is solidified in the chamber 1 to be manufactured as an ingot 5.

The ingot 5 is supported by a dummy block 7 at its lower end, and a lower end of the dummy block 7 is coupled to a shaft 9. The shaft 9, which is vertically movably installed, is lowered to extract the ingot 5. The shaft 9 is supported by a shaft holder 10, and the shaft 9 is fastened to a screw 11 and a shaft guide 13 to move therewith.

Meanwhile, the shaft holder 10 vertically moves along the shaft guide 13 lengthily installed in the vertical direction, and the screw 11 is supported by a support plate 14 at its lower end.

In the conventional art, the height of the shaft guide 13 is about 2 L as shown. This is because a stroke of L is further needed such that the shaft 9 extracts the ingot 5 having a height of L and discharges the ingot to the outside. Referring to FIG. 2, since the ingot 5 is disposed in the chamber 1 even when the shaft 9 lowers the ingot 5 to a height of L, the ingot 5 can be discharged to the outside only when the ingot is further lowered by the stroke of L as shown in FIG. 3.

As described above, the secured stroke of the extraction apparatus eventually increases the size of equipment and cost in equipment investment.

SUMMARY OF THE INVENTION

In order to solve the problems, the present invention provides an apparatus and method of extracting a silicon ingot capable of reducing the height of equipment for extracting the silicon ingot.

Additional aspects and/or advantages of the invention will be set forth in part in the description which follows and, in part, will be obvious from the description, or may be learned by practice of the invention.

In order to accomplish the object, the present invention provides an apparatus for extracting a silicon ingot, which includes: a chamber in which a silicon source material introduced into a cold crucible is melted; a primary extraction apparatus vertically movably installed in the chamber and configured to solidify the molten silicon to extract the silicon ingot; a movable apparatus configured to horizontally move the primary extraction apparatus; and a secondary extraction apparatus vertically movably installed under the chamber and configured to extract the silicon ingot in a state in which the primary extraction apparatus is moved to one side.

The primary extraction apparatus may include a first shaft vertically movable with respect to the chamber; a first screw to which the first shaft is movably fastened; and a shaft guide configured to guide movement of the first shaft.

A dummy block configured to support a lower end of the ingot may be detachably coupled to an upper end of the first shaft.

The first shaft may be fixed to a shaft holder movably installed at the first screw and the shaft guide.

The secondary extraction apparatus may include a second shaft vertically installed under the chamber; a support plate guided to be raised and lowered by the second shaft and configured to support the dummy block; and a second screw to which the support plate is fastened to be raised and lowered so that the support plate is raised and lowered along the second shaft.

The movable apparatus may include a movable plate configured to support the primary extraction apparatus; and a movable guide at which the movable plate is horizontally movably installed.

Cooling water may be circulated through the first shaft disposed in the chamber.

The primary extraction apparatus may extract the silicon ingot at a low speed, and the secondary extraction apparatus may extract the silicon ingot at a high speed.

The primary extraction apparatus may extract the silicon ingot at a speed of 0.5 to 10.0 mm/min, and the secondary extraction apparatus may extract the silicon ingot at a speed of 100 to 500 mm/min.

A vacuum bellows may be installed at an upper end of the primary extraction apparatus to seal the secondary extraction apparatus.

The present invention also provides a method of extracting a silicon ingot, which includes: introducing a silicon source material into a cold crucible disposed in a chamber and melting the material; lowering and solidifying the silicon melted in the chamber using a primary extraction apparatus and primarily extracting the silicon ingot; horizontally moving the primary extraction apparatus; and lowering and secondarily extracting the solidified silicon ingot using a secondary extraction apparatus.

The method may further include, before primarily extracting the silicon ingot, circulating cooling water through the primary extraction apparatus.

The silicon ingot may be extracted at a low speed in the primary extraction, and may be extracted at a high speed in the secondary extraction.

The primary extraction may be performed at a speed of 0.5 to 10.0 mm/min, and the secondary extraction may be performed at a speed of 100 to 500 mm/min.

BRIEF DESCRIPTION OF THE DRAWINGS

The above and other objects, features and advantages of the present invention will become more apparent to those of ordinary skill in the art by describing in detail example embodiments thereof with reference to the attached drawings, in which.

DETAILED DESCRIPTION OF EXAMPLE EMBODIMENTS

Hereinafter, an exemplary embodiment of an apparatus and method of extracting a silicon ingot in accordance with the present invention will be described with reference to the accompanying drawings.

Figure 1:
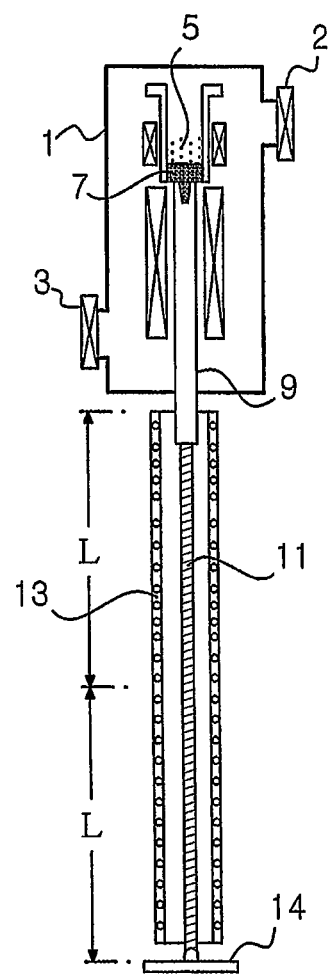
FIGS. 1 to 3 are operation views showing a process of extracting a silicon ingot using the conventional art.
Figure 2:
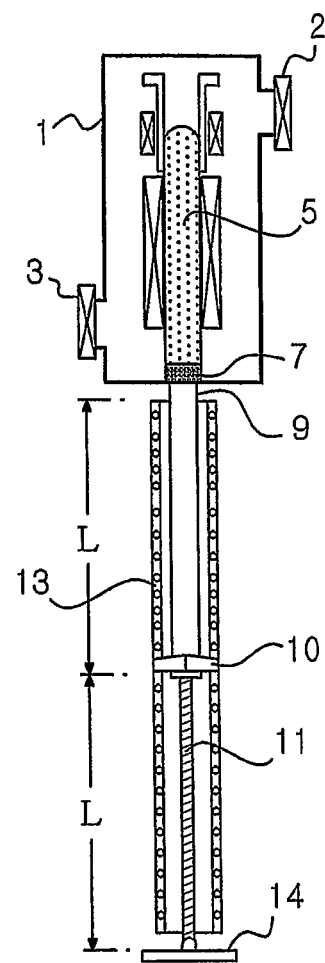
Figure 3:
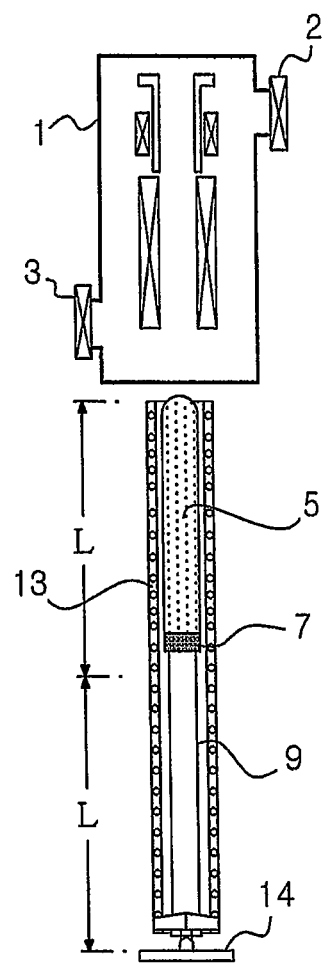
Figure 4:
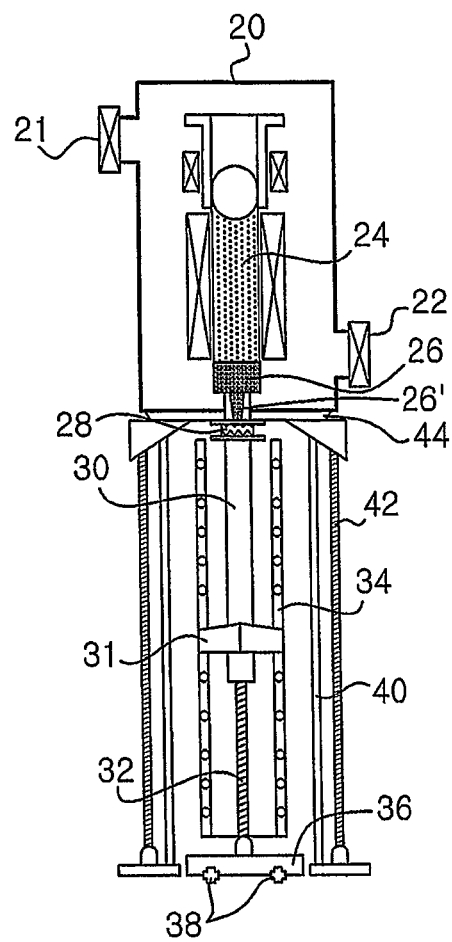
FIG. 4 is a front view of an apparatus for extracting a silicon ingot in accordance with the present invention.
Figure 5:
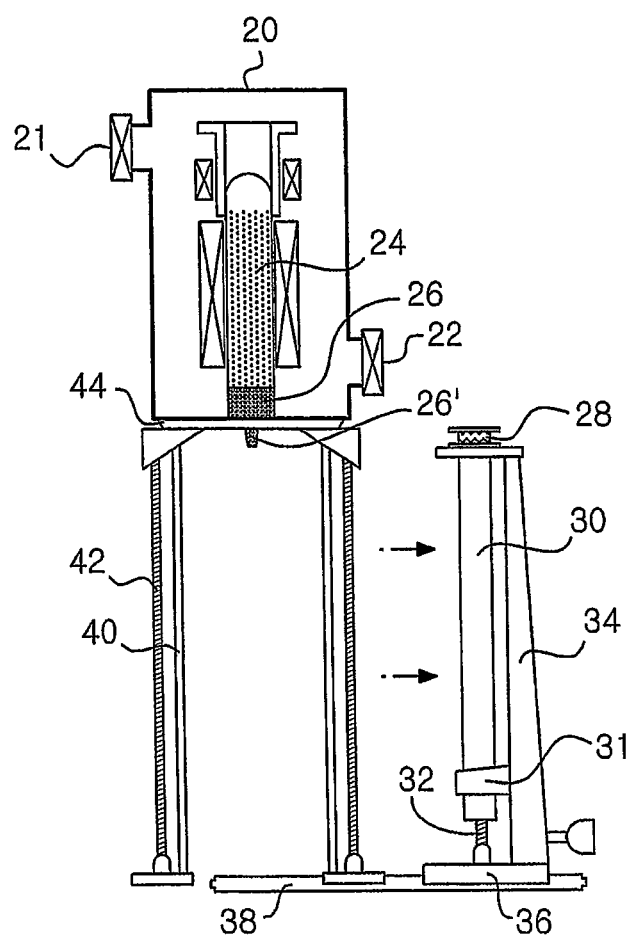
FIG. 5 is a side view of the apparatus for extracting the silicon ingot in accordance with the present invention.
Figure 6:
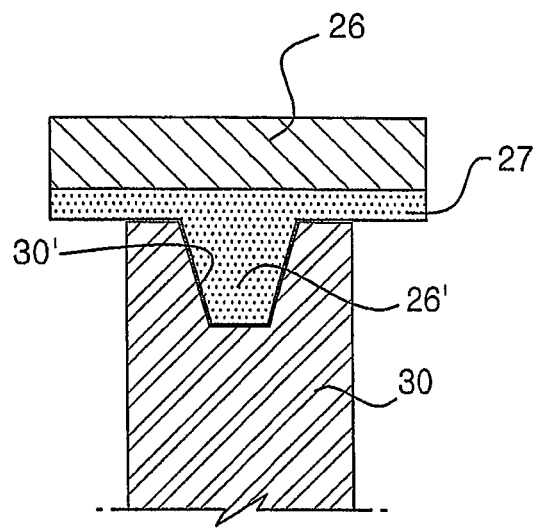
FIG. 6 is a cross-sectional view showing a shaft and a dummy block, which are coupled to each other, constituting an embodiment of the present invention.
Figure 7:
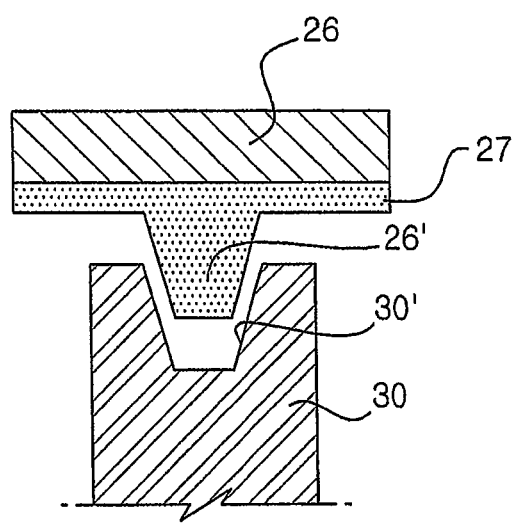
FIG. 7 is a cross-sectional view showing the shaft and the dummy block, which are separated from each other, constituting an embodiment of the present invention.

FIG. 4 is a front view of an apparatus for extracting a silicon ingot in accordance with the present invention, FIG. 5 is a side view of the apparatus for extracting the silicon ingot in accordance with the present invention, and FIGS. 6 and 7 are cross-sectional views showing a coupling relation between a shaft and a dummy block constituting an embodiment of the present invention.

According to the drawings, the apparatus for extracting the silicon ingot in accordance with the present invention includes a chamber 20 in which a silicon source material introduced into a cold crucible is melted, a primary extraction apparatus vertically movably installed in the chamber 20 and configured to solidify the molten silicon and extract a silicon ingot 24; a movable apparatus configured to move the primary extraction apparatus in a lateral direction; and a secondary extraction apparatus vertically movably installed under the chamber 20 and configured to extract the silicon ingot 24 in a state in which the primary extraction apparatus is moved in the lateral direction.

A silicon source material is introduced into the cold crucible in an inner space of the chamber 20. A gas inlet 21 and a gas outlet 22 are installed at upper and lower ends of the chamber 20, respectively. The gas inlet 21 and the gas outlet 22 are paths through which a gas for manufacturing the silicon ingot 24 is introduced and discharged.

In addition, a lower end of the ingot 24 is supported by a dummy block 26. The dummy block 26 is generally formed of graphite. The dummy block 26 is provided with a coupling plate 27, to which a coupling protrusion 26' corresponding to a coupling groove 30' of a first shaft 30 is fastened. The coupling protrusion 26' is inserted into the coupling groove 30' so that the dummy block 26 is coupled to the first shaft 30. That is, the dummy block 26 and the first shaft 30 are detachably coupled to each other by the coupling protrusion 26' fastened to the coupling plate 27 and the coupling groove 30'.

A vacuum bellows 28 is installed in a space between the dummy block 26 and the first shaft 30. The vacuum bellows 28 is provided to seal the secondary extraction apparatus, and is moved with the primary extraction apparatus after primary extraction. In addition, another sealing means, rather than the vacuum bellows, may be provided to seal the secondary extraction apparatus.

Meanwhile, the primary extraction apparatus of the present invention includes the first shaft 30 vertically movable with respect to the chamber 20, a first screw 32 to which the first shaft 30 is movably fastened, and a shaft guide 34 configured to guide movement of the first shaft 30.

Figure 8:
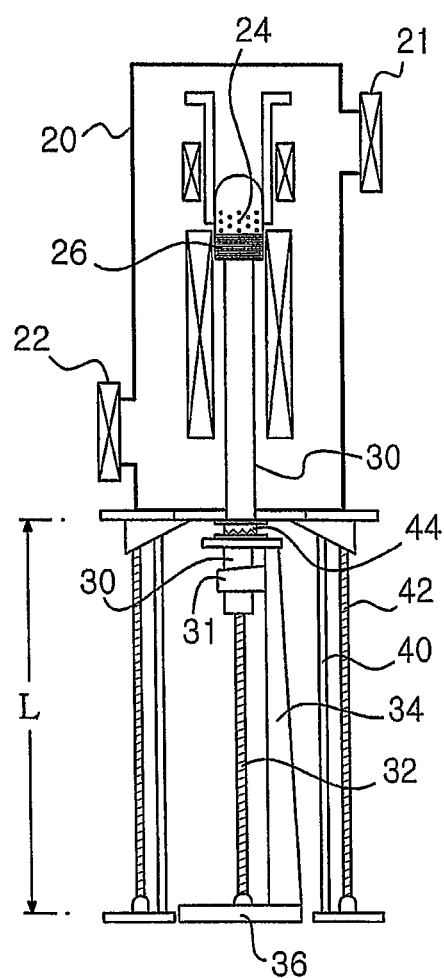
FIGS. 8 to 10 are operation views showing a process of extracting an ingot using the apparatus for extracting the silicon ingot in accordance with the present invention.

The primary extraction apparatus, which is lengthily installed in a vertical direction, has a height of L as shown in FIG. 8. This is reduced to a half of the height of 2 L of the conventional shaft guide 13. In the present invention, as described above, the entire equipment manufacturing cost can be reduced by reducing the height of the equipment.

Here, since the first shaft 30 is heated to a high temperature range in the chamber 20, a water cooling structure to circulate cooling water is needed.

The shaft guide 34 is provided with a shaft holder 31 to support the first shaft 30 with respect to the shaft guide 34. The shaft holder 31 is installed to be movable along the shaft guide 34. The shaft guide 34 is generally a linear motion (LM) guide.

Meanwhile, a movable plate 36 is installed at a lower end of the primary extraction apparatus. The movable plate 36 functions to support the first screw 32 and the shaft guide 34. In addition, the movable plate 36 is movably installed at a movable guide 38. As shown in FIG. 5, the movable guide 38 is lengthily installed in a horizontal direction so that the primary extraction apparatus can be moved in the horizontal direction after primary extraction.

Next, the secondary extraction apparatus of the present invention includes a second shaft 40 vertically installed under the chamber 20, a support plate 44 guided to be raised and lowered by the second shaft 40 and configured to support the dummy block 26, and a second screw 42 to which the support plate 44 is fastened to be raised and lowered so that the support plate 44 is raised and lowered along the second shaft 40.

The second shaft 40 is installed to be disposed outside the first shaft 30. In addition, the support plate 44 is disposed at an upper end of the secondary extraction apparatus to support the dummy block 26. The support plate 44 is lowered while supporting the dummy block 26 upon secondary extraction of the ingot 24.

In this embodiment, the primary extraction apparatus performs an extraction operation at a low speed, and the secondary extraction apparatus performs an extraction operation at a high speed. Preferably, the primary extraction apparatus extracts the ingot 24 at a speed of 0.5 to 10.0 mm/min, and the secondary extraction apparatus extracts the ingot 24 at a speed of 100 to 500 mm/min. In other words, elevation speed of the first shaft 30 is 0.5 to 10.0 mm/min, and elevation speed of the second shaft 40 is 100 to 500 mm/min.

The reasons for differentiating the speeds of the primary extraction and the second extraction are as follows. In the embodiment, the secondary extraction apparatus is an apparatus for secondarily extracting the ingot after the primary extraction apparatus primarily extracts the ingot. Actually, a step of solidifying and manufacturing the ingot 24 is performed upon the primary extraction, and the secondary extraction is a step of discharging the solidified ingot 24 to the outside. Accordingly, since the ingot 24 should be solidified upon the primary extraction, the first shaft 30 should be lowered at a low speed according to process conditions, and since the already solidified ingot 24 is extracted upon the secondary extraction, the second shaft 40 is lowered at a high speed to further increase process speed.

Hereinafter, a process of extracting the silicon ingot using the apparatus for extracting the silicon ingot in accordance with the present invention having the above-mentioned configuration will be described in detail.

Figure 9:
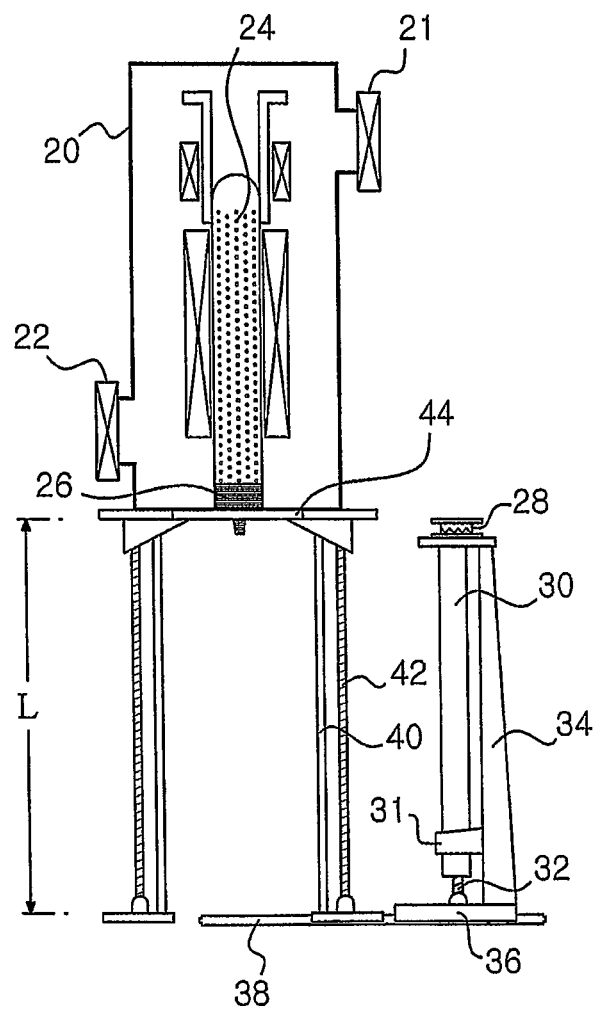
Figure 10:
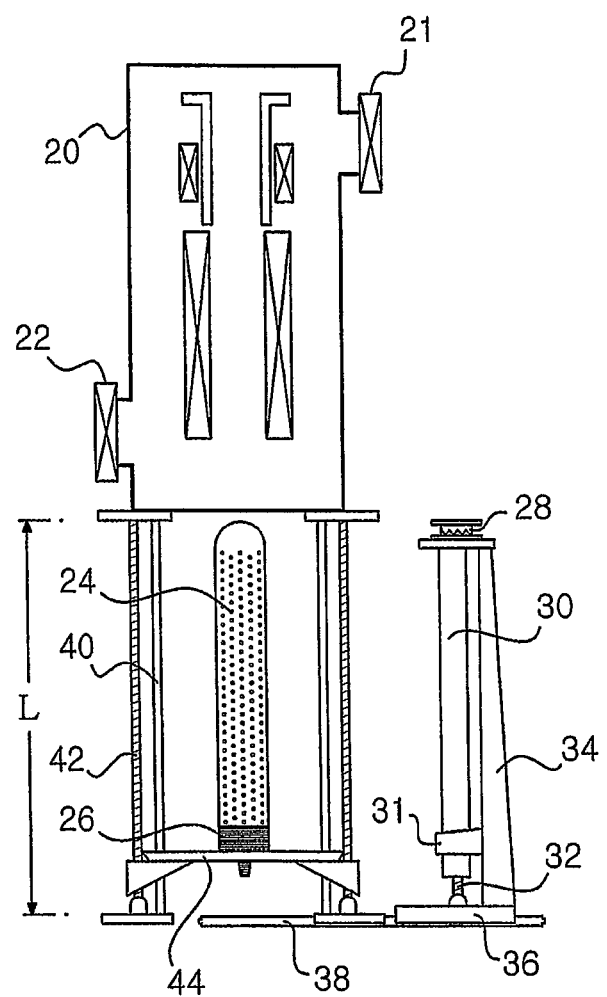

FIGS. 8 to 10 are operation views showing a process of extracting the ingot using the apparatus for extracting the silicon ingot in accordance with the present invention.

First, referring to FIG. 8, the first shaft 30 is heated to a high temperature range in the chamber 20 before the primary extraction. Here, in order to prevent deformation of the first shaft 30 due to the high temperature, cooling water is circulated through the first shaft 30.

Hereinafter, the first shaft 30 is lowered along the first screw 32. The first shaft 30 may be moved at a lowering speed of 0.5 to 10.0 mm/min. Here, the shaft holder 31 enables the first shaft 30 to lower along the shaft guide 34, and when the first shaft 30 is completely lowered, the silicon ingot 24 is solidified and the primary extraction is terminated.

After completion of the primary extraction of the ingot 24, as shown in FIG. 9, the movable plate 36 configured to support the primary extraction apparatus is horizontally moved toward a side surface along the movable guide 38. When the primary extraction apparatus is moved as described above, a predetermined space is formed at a place at which the primary extraction apparatus is disposed before the movement, and the vacuum bellows 28 is removed.

Accordingly, the secondary extraction apparatus extracts the ingot 24 into the space. That is, referring to FIG. 10, the support plate 44 is lowered along the second shaft 40 via the second screw 42 to discharge the ingot 24 to the outside. The second shaft 40 may be moved at a lowering speed of 100 to 500 mm/min. Here, the ingot 24 is lowered while being supported by the support plate 44 via the dummy block 26 to be in a state dischargeable to the outside. Then, the secondary extraction of the ingot 24 is completed.

As can be seen from the foregoing, the height of the apparatus for extracting the silicon ingot of the present invention is reduced to half in comparison with the conventional art. This is because two apparatuses for extracting the silicon ingot are provided to extract the ingot through two steps. As described above, as the height of the extraction apparatus is reduced, manufacturing cost of the equipment can be reduced and installation space of the extraction apparatus can also be secured.

While the invention has been shown and described with reference to certain example embodiments thereof, it will be understood by those skilled in the art that various changes in form and details may be made therein without departing from the spirit and scope of the invention as defined by the appended claims.

What is claimed is:

1. An apparatus for extracting a silicon ingot, comprising:
a chamber in which a silicon source material introduced into a cold crucible is melted;
a primary extraction apparatus vertically movably installed in the chamber and configured to solidify a molten silicon to extract the silicon ingot;
a movable apparatus configured to horizontally move the primary extraction apparatus; and
a secondary extraction apparatus vertically movably installed under the chamber and configured to extract the silicon ingot in a state in which the primary extraction apparatus is moved to one side,
wherein the primary extraction apparatus comprises:
a first shaft vertically movable with respect to the chamber;
a first screw to which the first shaft is movably fastened; and
a shaft guide configured to guide movement of the first shaft.

2. The apparatus according to claim 1, wherein a dummy block configured to support a lower end of the ingot is detachably coupled to an upper end of the first shaft.

3. The apparatus according to claim 2, wherein the first shaft is fixed to a shaft holder movably installed at the first screw and the shaft guide.

4. The apparatus according to claim 1, wherein the secondary extraction apparatus comprises:
a second shaft vertically installed under the chamber;
a support plate guided to be raised and lowered by the second shaft and configured to support a dummy block; and a second screw to which the support plate is fastened to be raised and lowered so that the support plate is raised and lowered along the second shaft.

5. The apparatus according to claim 1, wherein the movable apparatus comprises:
a movable plate configured to support the primary extraction apparatus; and
a movable guide at which the movable plate is horizontally movably installed.

6. The apparatus according to claim 1, wherein cooling water is circulated through the first shaft disposed in the chamber.

7. The apparatus according to claim 1, wherein the primary extraction apparatus extracts the silicon ingot at a low speed, and the secondary extraction apparatus extracts the silicon ingot at a high speed.

8. The apparatus according to claim 7, wherein the primary extraction apparatus extracts the silicon ingot at a speed of 0.5 to 10.0 mm/min, and the secondary extraction apparatus extracts the silicon ingot at a speed of 100 to 500 mm/min.

9. The apparatus according to claim 1, wherein a vacuum bellows is installed at an upper end of the primary extraction apparatus to seal the secondary extraction apparatus.

10. A method of extracting a silicon ingot, comprising:
introducing a silicon source material into a cold crucible disposed in a chamber and melting the silicon source material;
lowering and solidifying the melted silicon ingot in the chamber using a primary extraction apparatus and primarily extracting the silicon ingot;
horizontally moving the primary extraction apparatus; and
lowering and secondarily extracting the solidified silicon ingot using a secondary extraction apparatus,
wherein the primary extraction apparatus comprises:
a first shaft vertically movable with respect to the chamber;
a first screw to which the first shaft is movably fastened; and
a shaft guide configured to guide movement of the first shaft.

11. The method according to claim 10, further comprising, before primarily extracting the silicon ingot, circulating cooling water through the primary extraction apparatus.

12. The method according to claim 10, wherein the silicon ingot is extracted at a low speed in a primary extraction, and the silicon ingot is extracted at a high speed in a secondary extraction.

13. The method according to claim 12, wherein the primary extraction is performed at a speed of 0.5 to 10.0 mm/min, and the secondary extraction is performed at a speed of 100 to 500 mm/min.

* * * * *